(12) United States Patent
Chen et al.

(10) Patent No.: US 12,580,151 B2
(45) Date of Patent: Mar. 17, 2026

(54) METHOD FOR PREPARING TEM SAMPLE

(71) Applicant: Shanghai Huali Integrated Circuit Corporation, Shanghai (CN)

(72) Inventors: Qiang Chen, Shanghai (CN); Liu Chen, Shanghai (CN); Jinde Gao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 528 days.

(21) Appl. No.: 18/150,932

(22) Filed: Jan. 6, 2023

(65) Prior Publication Data

US 2023/0268159 A1 Aug. 24, 2023

(30) Foreign Application Priority Data

Feb. 21, 2022 (CN) .......................... 202210154880.2

(51) Int. Cl.
| | |
|---|---|
| *H01J 37/31* | (2006.01) |
| *G01N 1/28* | (2006.01) |
| *G01N 23/2202* | (2018.01) |
| *H01J 37/317* | (2006.01) |

(52) U.S. Cl.
CPC .......... *H01J 37/31* (2013.01); *H01J 37/3178* (2013.01); *H01J 2237/31749* (2013.01)

(58) Field of Classification Search
CPC .................. H01J 37/31; H01J 37/3178; H01J 2237/31749; H01J 2237/31745; G01N 1/286; G01N 1/2813; G01N 23/2202
See application file for complete search history.

(56) References Cited

U.S. PATENT DOCUMENTS

| | | | | |
|---|---|---|---|---|
| 2009/0296073 A1* | 12/2009 | Wagganer | .......... | G01N 23/2202 |
| | | | | 356/72 |
| 2017/0053778 A1* | 2/2017 | Chen | ........................ | G01N 1/28 |
| 2022/0262593 A1* | 8/2022 | Fischione | ............... | H01J 37/31 |

FOREIGN PATENT DOCUMENTS

| | | | |
|---|---|---|---|
| CN | 104155156 A | | 11/2014 |
| CN | 104198241 A | * | 12/2014 |
| CN | 105973674 A | | 9/2016 |

(Continued)

OTHER PUBLICATIONS

English Translation of 18150932 Gao with Paragraph Numbers (Year: 2014).*

(Continued)

*Primary Examiner* — Robert H Kim
*Assistant Examiner* — Laura Eloise Tandy
(74) *Attorney, Agent, or Firm* — Banner & Witcoff, Ltd.

(57) ABSTRACT

The present application discloses a method for preparing a TEM sample, comprising: step 1, step 1, providing a chip sample having a metal protective layer formed on a first surface; step 2, fixing the chip sample on a sample table of a FIB system; step 3, performing the first time of FIB cutting on the metal protective layer along a first direction, so as to form a groove, wherein the first direction is the width direction of the TEM sample, and the inner side surface of the groove is arc-shaped so that the thickness of the metal protective layer in a groove area gradually changes; and step 4, performing the second time of FIB cutting along a third direction to thin the chip sample and form the TEM sample, wherein the third direction is a direction from the metal protective layer to the chip sample.

14 Claims, 9 Drawing Sheets

(56)         References Cited

FOREIGN PATENT DOCUMENTS

| CN | 107167485  | A | 9/2017 |
|----|------------|---|--------|
| CN | 112881439  | A | 6/2021 |
| CN | 113948387  | A | 1/2022 |
| KR | 20040031279 | A | 4/2004 |

OTHER PUBLICATIONS

Aug. 5, 2025—(CN) First Search Report issued by CNIPA—App 2022101548802, partial English translation.

* cited by examiner

Figure 1:
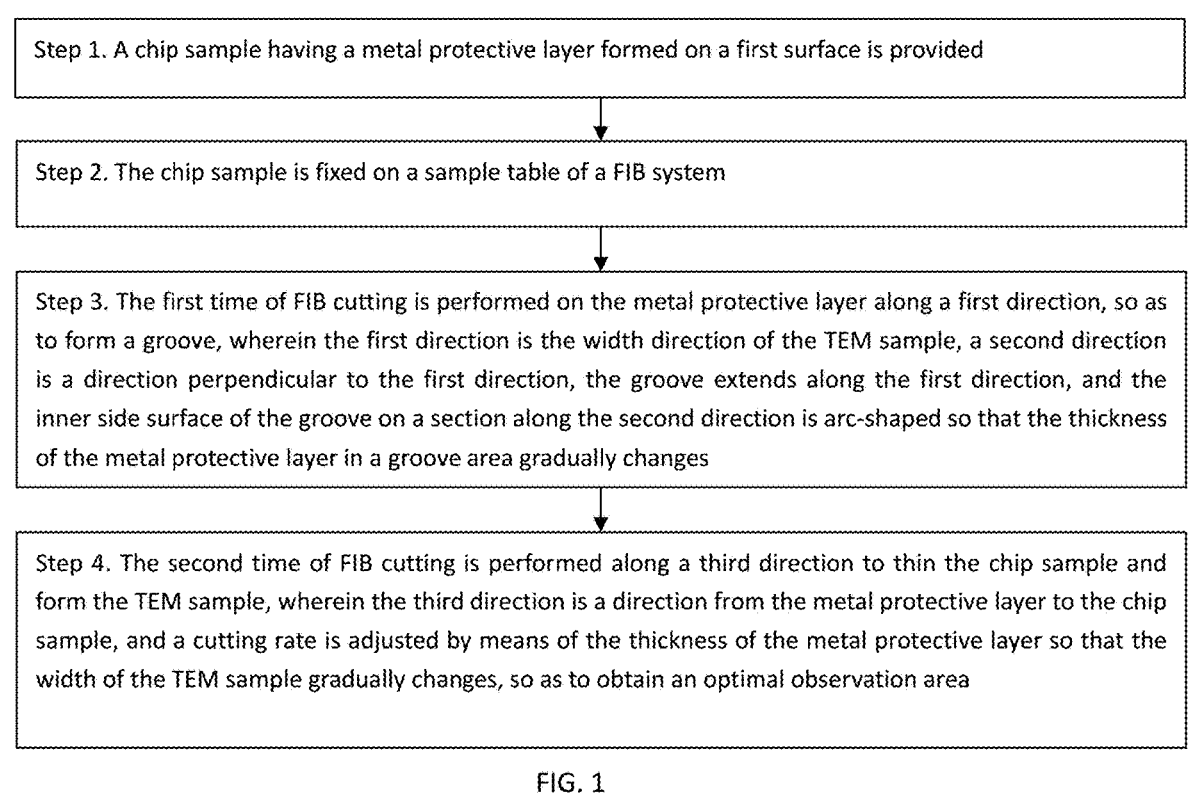

Step 1. A chip sample having a metal protective layer formed on a first surface is provided Step 2. The chip sample is fixed on a sample table of a FIB system Step 3. The first time of FIB cutting is performed on the metal protective layer along a first direction, so as to form a groove, wherein the first direction is the width direction of the TEM sample, a second direction is a direction perpendicular to the first direction, the groove extends along the first direction, and the inner side surface of the groove on a section along the second direction is arc-shaped so that the thickness of the metal protective layer in a groove area gradually changes Step 4. The second time of FIB cutting is performed along a third direction to thin the chip sample and form the TEM sample, wherein the third direction is a direction from the metal protective layer to the chip sample, and a cutting rate is adjusted by means of the thickness of the metal protective layer so that the width of the TEM sample gradually changes, so as to obtain an optimal observation area

METHOD FOR PREPARING TEM SAMPLE

CROSS-REFERENCE TO RELATED APPLICATIONS

This application claims priority to Chinese Patent Application No. CN 202210154880.2, filed on Feb. 21, 2022, the disclosure of which is incorporated herein by reference in its entirety.

TECHNICAL FIELD

The present application relates to a method for manufacturing a semiconductor integrated circuit, in particular to a method for preparing a transmission electron microscope (TEM) sample.

BACKGROUND

The transmission electron microscopy is extremely widely applied and increasingly important in various fields, including integrated circuit analysis. Double-beam focused ion beam (FIB) sample preparation is the most important TEM sample preparation means in the field of semiconductors.

The requirements for the thickness of a TEM sample to be prepared vary according to different sample process nodes and analysis target structures. For example, at the 55 nm technology node, most TEM samples are required to be about 60-80 nm thick; and at the technical node of 14 nm FinFET, the thickness of the TEM sample reaches 30 nm, even 10 nm in some cases.

The existing method for preparing a TEM sample requires reduction of the overall thickness of a chip sample to desired thickness, and the thickness determination is mainly based on the experience of a sample preparation worker. Therefore, an excessively thin or excessively thick case may often occur due to inaccurate determination, which affects the analysis quality.

BRIEF SUMMARY

According to some embodiments in this application, the present application is to provide a method for preparing a TEM sample, so as to realize accurate control on the thickness of the TEM sample and thereby improve the TEM analysis quality.

The method for preparing a TEM sample provided by the present application includes the following steps:

step 1, providing a chip sample having a metal protective layer, the metal protective layer being formed on a first surface of the chip sample;

step 2, fixing the chip sample on a sample table of a FIB system;

step 3, performing the first time of FIB cutting on the metal protective layer using a FIB, so as to form a groove, wherein a first direction is the width direction of the TEM sample, and a second direction is a direction perpendicular to the first direction in the first surface;

a direction of the first time of FIB cutting is the first direction, and the groove extends along the first direction;

the inner side surface of the groove on a section along the second direction is arc-shaped; and in the second direction, the groove is located in an area for forming the TEM sample, and the thickness of the metal protective layer at each position on the inner side surface of the groove gradually changes; and step 4, performing the second time of FIB cutting on the chip sample using the FIB, the second time of FIB cutting thinning the chip sample and forming the TEM sample, wherein a direction of the second time of FIB cutting is a third direction, and the third direction is a direction from the metal protective layer to the chip sample; in the second time of FIB cutting, a cutting rate at a corresponding position is adjusted by means of the thickness of the metal protective layer, so as to adjust the width of the TEM sample; when the metal protective layer becomes thicker, the cutting rate of the second time of FIB cutting becomes slower, and when the metal protective layer becomes thinner, the cutting rate of the second time of FIB cutting becomes faster; in an area for forming the groove, the width of the TEM sample gradually changes due to a feature that the thickness of the metal protective layer gradually changes, an optimal observation area for TEM analysis is obtained from the gradually changing width of the TEM sample, and an excessively thick area and an excessively thin area are respectively located on two sides of the optimal observation area.

In some cases, the chip sample is obtained by cutting or thinning a wafer composed of a semiconductor substrate.

In some cases, the metal protective layer is formed before or after the wafer is cut or thinned.

In some cases, a semiconductor device layer is formed on the semiconductor substrate, and the top surface of the semiconductor device layer is the first surface.

In some cases, the material of the metal protective layer includes platinum or tungsten.

In some cases, in step 1, the thickness of the chip sample is 300-1000 nm.

In some cases, the thickness of the metal protective layer is 2-5 μm.

In some cases, in step 2, the chip sample is fixed on the sample table of the FIB system by being welded on a TEM copper ring.

In some cases, in step 3, the arc shape of the inner side surface of the groove on the section along the second direction includes a circular arc shape.

In some cases, the diameter of a circle corresponding to the circular arc shape is 3-10 μm.

In some cases, the third direction is perpendicular to the first surface.

In some cases, the second time of FIB cutting forms a first side and a second side of the TEM sample sequentially, and outside the groove, the first side and the second side of the TEM sample are parallel to each other and are perpendicular to the width direction of the TEM sample.

In some cases, during the second time of FIB cutting, a loss occurs to the thickness of the metal protective layer; and when the metal protective layer in the excessively thin area is fully removed and a damage occurs to the material of the chip sample at the bottom, the second time of FIB cutting ends.

In some cases, in step 4, the minimum width of the optimal observation area of the TEM sample is 30 nm or less than 10 nm.

In the present application, after the metal protective layer of the chip sample is formed and before the FIB cutting is performed on the chip sample, FIB cutting is first performed on the metal protective layer, i.e., the first time of FIB cutting. The first time of FIB cutting forms, in the metal protective layer, the groove extending along the width direction of the TEM sample. The inner side surface of the groove presents an arc-shaped structure and the groove is located in the area for forming the TEM sample. The groove causes the thickness of the metal protective layer to change continuously. Then the second time of FIB cutting is performed on the chip sample. In the second time of FIB cutting, due to the feature that the thickness of the metal protective layer in the area for forming the TEM sample changes continuously and the cutting rate of the second time of FIB cutting changes with the change of the thickness of the metal protective layer, the width of the finally formed TEM sample changes continuously, making it easy to obtain the optimal observation area for TEM analysis from the continuously changing width. In the present application, the width of the TEM sample is considered to be the thickness. Therefore, in the second time FIB cutting of the present application, even if a deviation occurs during the cutting, the deviation just leads to a movement of the optimal observation area towards a side of the excessively thick area or a side of the excessively thin area, while the corresponding optimal observation area can still be obtained, thereby eliminating the defect of an excessively thick or excessively thin TEM sample in the existing method. Accordingly, the present application can realize accurate control on the thickness of the TEM sample and thereby improve the TEM analysis quality.

BRIEF DESCRIPTION OF THE DRAWINGS

The present application is described in detail below with reference to the drawings and specific implementations FIG. 1 is a flowchart of a method for preparing a TEM sample according to an embodiment of the present application.

DETAILED DESCRIPTION OF THE DISCLOSURE

FIG. 1 is a flowchart of a method for preparing a TEM sample 106 according to an embodiment of the present application. The method for preparing the TEM sample 106 according to an embodiment of the present application includes the following steps.

Figure 2A:
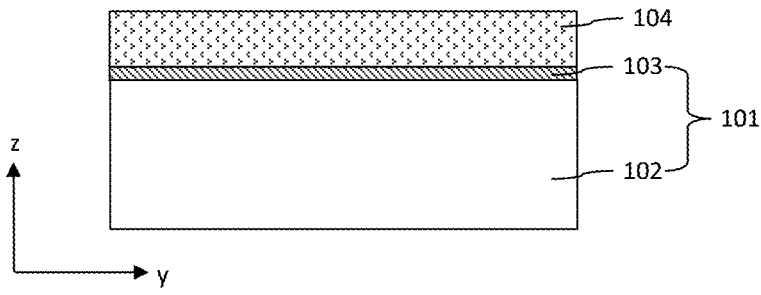
FIG. 2A is a side view of a chip sample provided in step 1 of the method for preparing a TEM sample according to an embodiment of the present application.

Step 1. Referring to FIG. 2A, a chip sample 101 having a metal protective layer 104 is provided, the metal protective layer 104 being formed on a first surface of the chip sample 101.

Figure 2B:
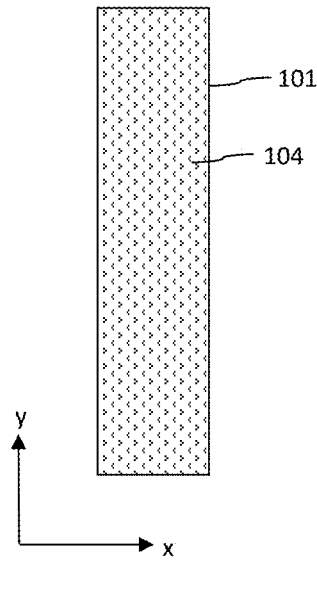
FIG. 2B is a top view of the chip sample provided in step 1 of the method for preparing a TEM sample according to an embodiment of the present application.

FIG. 2A is a side view on a yz plane. FIG. 2B is a top view on an xy plane corresponding to FIG. 2A.

In this embodiment of the present application, the chip sample 101 is obtained by cutting or thinning a wafer composed of a semiconductor substrate 102.

In some embodiments, the cutting or thinning of the wafer can be realized by mechanical cutting or thinning. After the wafer is cut or thinned, the thickness of the chip sample 101 is 300-1000 nm.

A semiconductor device layer 103 is formed on the semiconductor substrate 102, and the top surface of the semiconductor device layer 103 is the first surface.

In some embodiments, a FinFET is formed in the semiconductor device layer 103. The FinFET is formed on a fin, and the fin is formed by performing patterned etching on the semiconductor substrate 102. The FinFET is usually applied to technology nodes below 14 nm.

The metal protective layer 104 is formed before or after the wafer is cut or thinned.

The material of the metal protective layer 104 includes platinum or tungsten.

The thickness of the metal protective layer 104 is 2-5 μm.

Step 2. The chip sample 101 is fixed on a sample table of a FIB system.

In some embodiments, the chip sample 101 is fixed on the sample table of the FIB system by being welded on a TEM copper ring.

Figure 3A:
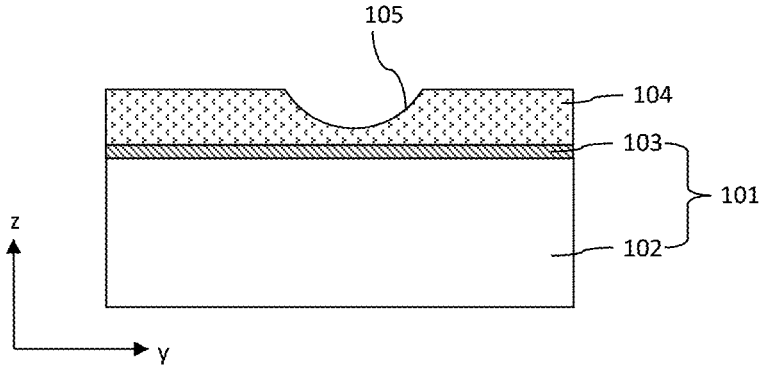
FIG. 3A is a side view of the chip sample provided after step 3 of the method for preparing a TEM sample according to an embodiment of the present application.

Step 3. Referring to FIG. 3A, the first time of FIB cutting is performed on the metal protective layer 104 using a FIB, so as to form a groove 105, wherein a first direction is the width direction of the TEM sample 106, and a second direction is a direction perpendicular to the first direction in the first surface.

Figure 3B:
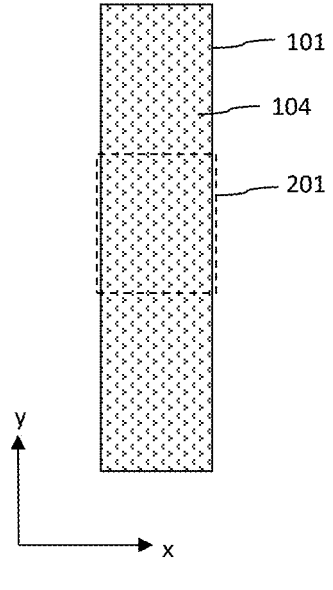
FIG. 3B is a top view of the chip sample provided after step 3 of the method for preparing a TEM sample according to an embodiment of the present application.

FIG. 3A is a side view on the yz plane. FIG. 3B is a top view on the xy plane corresponding to FIG. 3A. The first direction is an x direction, and the second direction is a y direction. In FIG. 3B, the dashed line box 201 represents an area for forming the groove 105.

A direction of the first time of FIB cutting is the first direction, and the groove 105 extends along the first direction.

The inner side surface of the groove 105 on a section along the second direction, i.e., on the yz plane corresponding to FIG. 3A, is arc-shaped.

In the second direction, the groove 105 is located in an area for forming the TEM sample 106, and the thickness of the metal protective layer 104 at each position on the inner side surface of the groove 105 gradually changes.

In some example embodiments, the arc shape of the inner side surface of the groove 105 on the section along the second direction is a circular arc shape. The diameter of a circle corresponding to the circular arc shape is 3-10 μm.

Figure 4A:
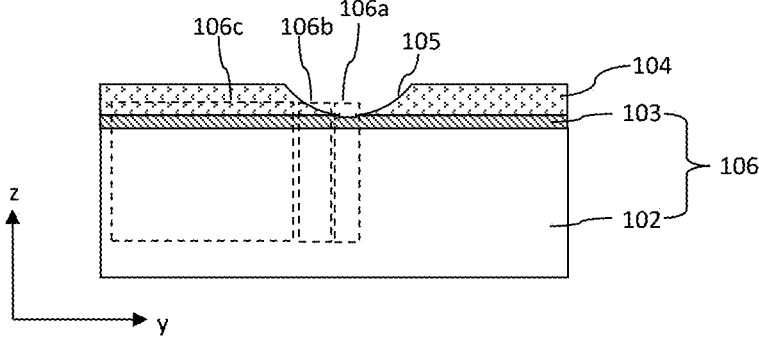
FIG. 4A is a side view of a TEM sample provided after step 4 of the method for preparing a TEM sample according to an embodiment of the present application.

Step 4. Referring to FIG. 4A, the second time of FIB cutting is performed on the chip sample 101 using the FIB, the second time of FIB cutting thinning the chip sample 101 and forming the TEM sample 106.

Figure 4B:
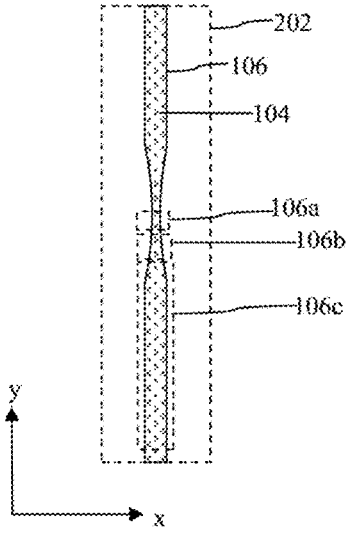
FIG. 4B is a top view of the TEM sample provided after step 4 of the method for preparing a TEM sample according to an embodiment of the present application.

FIG. 4A is a side view on the yz plane. FIG. 4B is a top view on the xy plane corresponding to FIG. 4A.

Since the TEM sample 106 is formed after the chip sample 101 is thinned, stacked layers of the TEM sample 106 re the same as those of the chip sample 101, that is, the stacked layers of the TEM sample 106 include the semiconductor substrate 102 and the semiconductor device layer 103.

A direction of the second time of FIB cutting is a third direction, and the third direction is a direction from the metal protective layer 104 to the chip sample 101. In the second time of FIB cutting, a cutting rate at a corresponding position is adjusted by means of the thickness of the metal protective layer 104, so as to adjust the width of the TEM sample 106. When the metal protective layer 104 becomes thicker, the cutting rate of the second time of FIB cutting becomes slower, and when the metal protective layer 104 becomes thinner, the cutting rate of the second time of FIB cutting becomes faster. In the area for forming the groove 105, the width of the TEM sample 106 gradually changes due to a feature that the thickness of the metal protective layer 104 gradually changes, an optimal observation area 106a for TEM analysis is obtained from the gradually changing width of the TEM sample 106, and an excessively thick area 106c and an excessively thin area 106b are respectively located on two sides of the optimal observation area 106a.

In this embodiment of the present application, the third direction is perpendicular to the first surface, and in this case, the third direction is the −z direction in FIG. 4A. In other embodiments, the third direction can also form an angle with respect to the −z direction.

Referring to FIG. 4B, the second time of FIB cutting forms a first side and a second side of the TEM sample 106 sequentially. Outside the groove, the first side and the second side of the TEM sample 106 are parallel to each other and are perpendicular to the width direction of the TEM sample 106. The dashed line box 202 represents the regional position of the chip sample 101. The second time of FIB cutting causes the first side and the second side of the chip sample 101 to move inward and forms the first side and second side of the TEM sample 106.

In the area for forming the groove 105, the first side and the second side of the TEM sample 106 are concave, resulting in a step-by-step change of the width of the TEM sample 106, and it is therefore not difficult to obtain the optimal observation area 106a in the TEM sample 106. That is, even if a control deviation occurs during the second time of FIB cutting, the deviation just leads to a movement of the optimal observation area 106a towards a side of the excessively thick area 106c or a side of the excessively thin area 106b, while the corresponding optimal observation area 106a can still be obtained.

In this embodiment of the present application, during the second time of FIB cutting, a loss occurs to the thickness of the metal protective layer 104. By comparing FIG. 3A and FIG. 4A, it can be seen that the metal protective layer 104 in FIG. 4A is thinner.

When the metal protective layer 104 in the excessively thin area 106b is fully removed and damage occurs to the material of the chip sample 101 at the bottom, the second time of FIB cutting ends. In this way, it is easy to control an end point of the second time of FIB cutting in this embodiment of the present application.

In some embodiments, the minimum width of the optimal observation area 106a of the TEM sample 106 is 30 nm or less than 10 nm, which is more applicable to TEM analysis of a FinFET that requires a relatively small thickness of the TEM sample 106.

In this embodiment of the present application, after the metal protective layer 104 of the chip sample 101 is formed and before the FIB cutting is performed on the chip sample 101, FIB cutting is first performed on the metal protective layer 104, i.e., the first time of FIB cutting. The first time of FIB cutting forms, in the metal protective layer 104, the groove 105 extending along the width direction of the TEM sample 106. The inner side surface of the groove 105 presents an arc-shaped structure and the groove 105 is located in the area for forming the TEM sample 106. The groove 105 causes the thickness of the metal protective layer 104 to change continuously. Then the second time of FIB cutting is performed on the chip sample 101. In the second time of FIB cutting, due to the feature that the thickness of the metal protective layer 104 in the area for forming the TEM sample 106 changes continuously and the cutting rate of the second time of FIB cutting changes with the change of the thickness of the metal protective layer 104, the width of the finally formed TEM sample 106 changes continuously, making it easy to obtain the optimal observation area 106a for TEM analysis from the continuously changing width. In the present application, the width of the TEM sample 106 is considered to be the thickness. Therefore, in the second time FIB cutting of this embodiment of the present application, even if a deviation occurs during the cutting, the deviation just leads to a movement of the optimal observation area 106a towards a side of the excessively thick area 106c or a side of the excessively thin area 106b, while the corresponding optimal observation area 106a can still be obtained, thereby eliminating the defect of an excessively thick or excessively thin TEM sample 106 in the existing method. Accordingly, this embodiment of the present application can realize accurate control on the thickness of the TEM sample 106 and thereby improve the TEM analysis quality.

The method according to the embodiment of the present application is described below in more details with reference to actual pictures.

FIGS. 5A-5E are sample pictures corresponding to the steps of the method for preparing a TEM sample according to the embodiment of the present application.

Figure 5A:
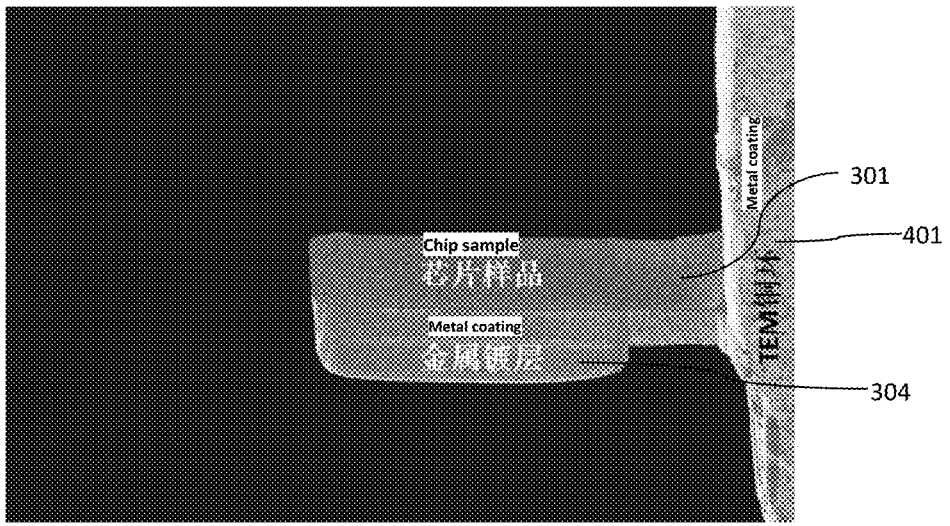
FIGS. 5A-5E are sample pictures corresponding to the steps of the method for preparing a TEM sample according to an embodiment of the present application.

FIG. 5A shows a chip sample 301 obtained after step 1. A metal protective layer 304, i.e., a metal coating is formed on a first surface of the chip sample 301. After step 2, the chip sample 301 is welded on a TEM copper ring 401.

Figure 5B:
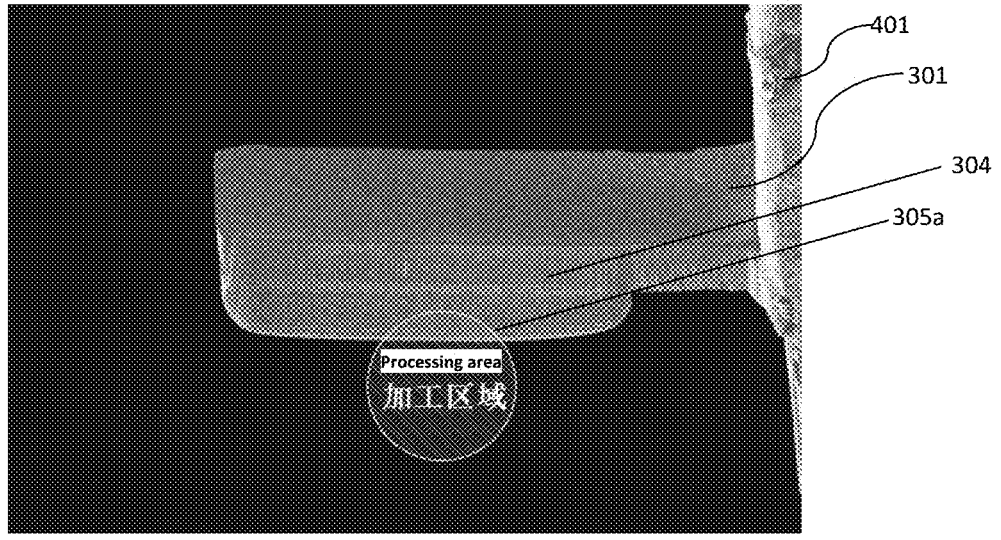

FIG. 5B shows a processing area 305a defined before the first time of FIB cutting in step 3. The processing area 305a is used to define an area for forming a groove 305.

Figure 5C:
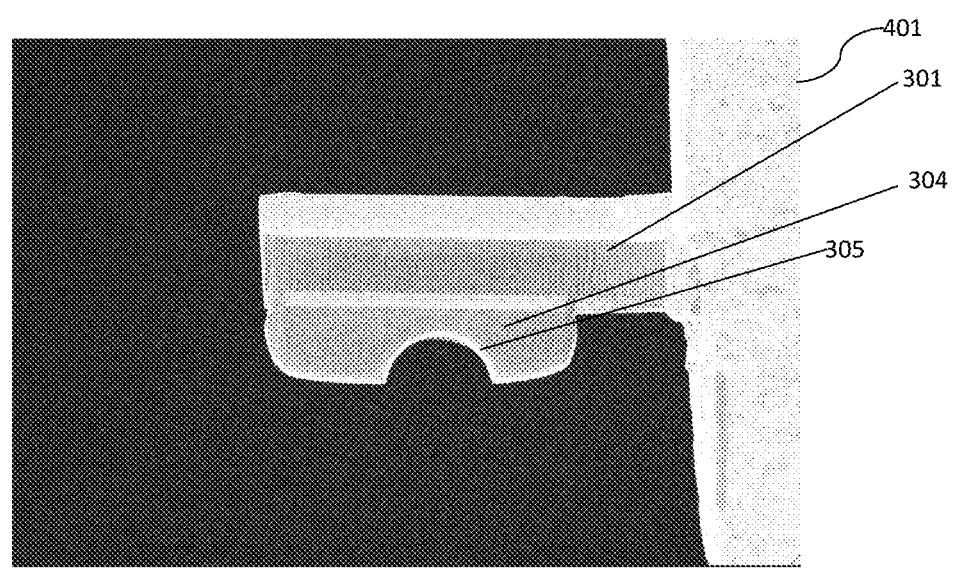

FIG. 5C shows that the groove 305 is formed after the first time of FIB cutting.

Figure 5D:
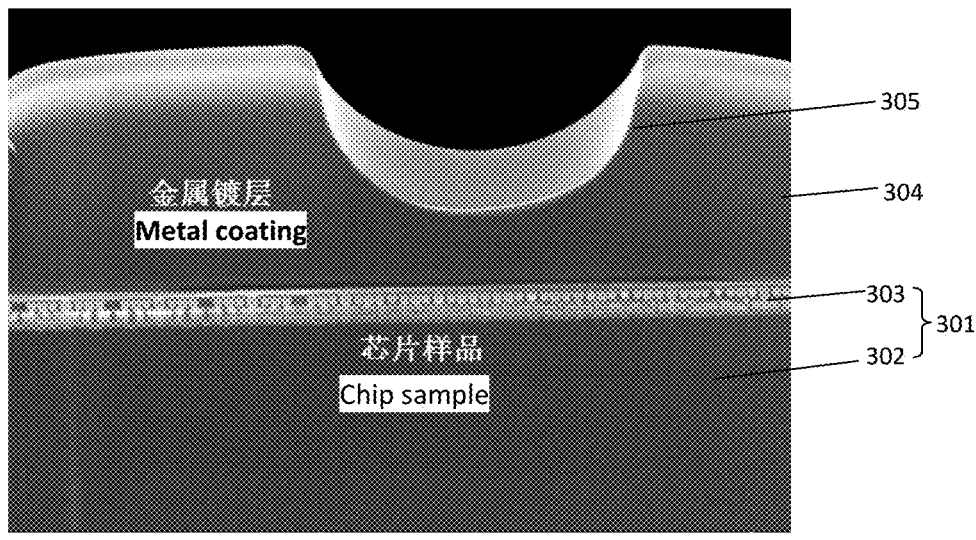

FIG. 5D shows that, after step 3 and before step 4, the direction of the FIB cutting can be changed by turning over the chip sample 301. FIG. 5D also shows stacked layers of the chip sample 301, i.e., a semiconductor substrate 302 and a semiconductor device layer 303.

Figure 5E:
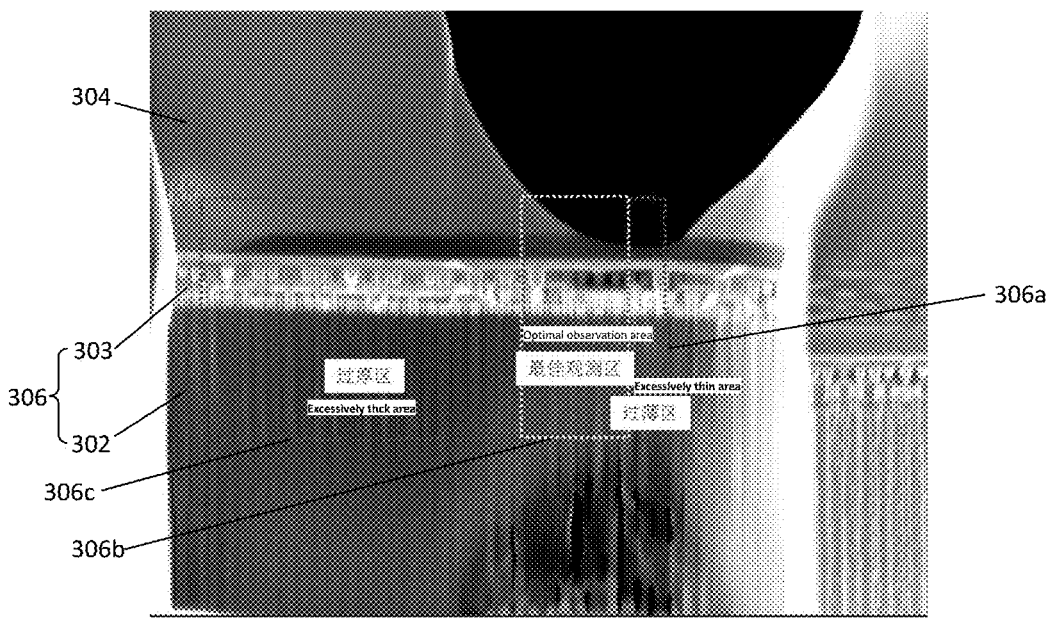

FIG. 5E shows that after the second time of FIB cutting in step 4, the chip sample 301 is thinned to obtain the TEM sample 306. The TEM sample 306 is divided into an optimal observation area 306a, an excessively thin area 306b, and an excessively thick area 306c according to the width.

Figure 6A:
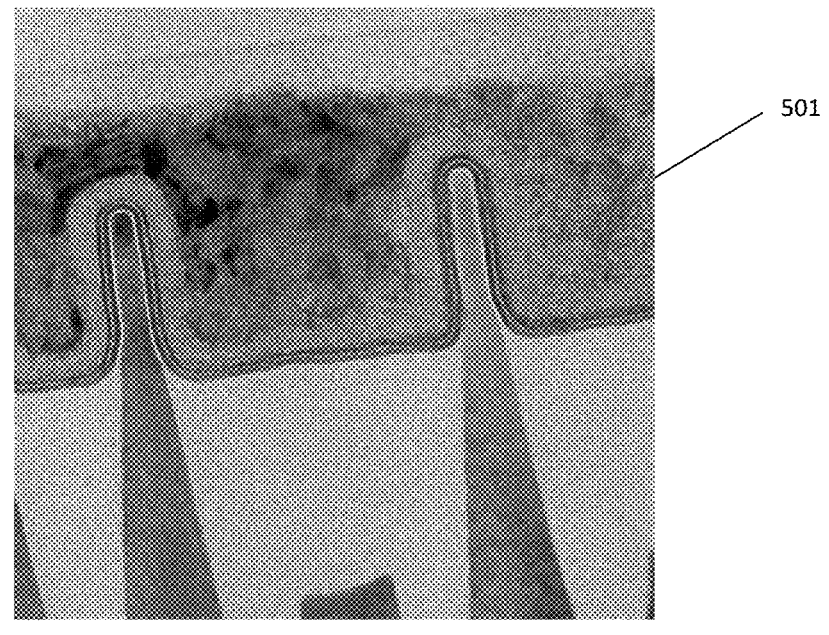
FIG. 6A is a TEM picture obtained by performing TEM analysis on an optimal observation area of the TEM sample formed by the method for preparing a TEM sample according to an embodiment of the present application.

During TEM analysis, an optimal TEM picture can be obtained from the optimal observation area 306a. FIG. 6A is a TEM picture 501 obtained by performing TEM analysis on the optimal observation area 306a in FIG. 5E. It can be seen that the TEM picture 501 is very clear.

Figure 6B:
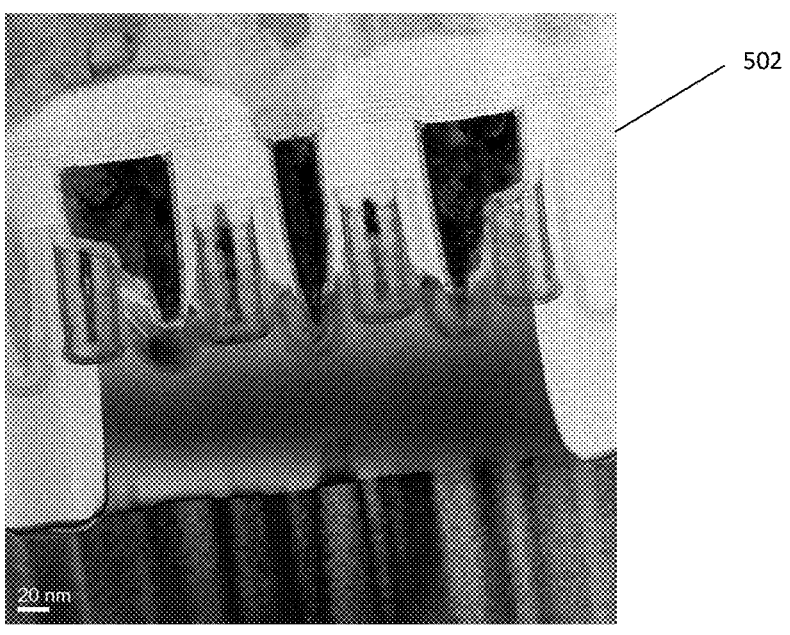
FIG. 6B is a TEM picture obtained by performing TEM analysis on an excessively thick area of the TEM sample formed by the method for preparing a TEM sample according to an embodiment of the present application.

FIG. 6B is a TEM picture 502 obtained by performing TEM analysis on the excessively thick area 306c in FIG. 5E. It can be seen that the quality of the TEM picture 502 is poorer than that of the TEM picture 501 in FIG. 6A.

Figure 6C:
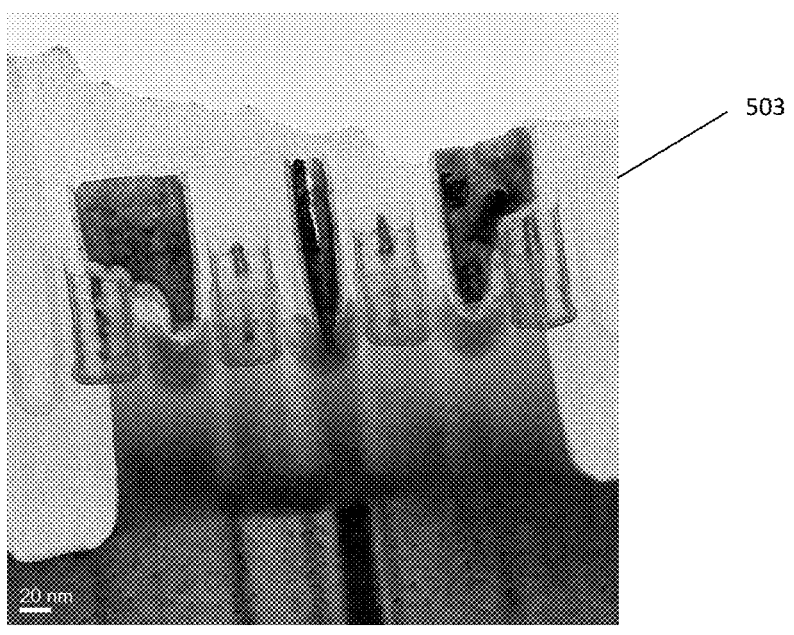
FIG. 6C is a TEM picture obtained by performing TEM analysis on an excessively thin area of the TEM sample formed by the method for preparing a TEM sample according to an embodiment of the present application.

FIG. 6C is a TEM picture 503 obtained by performing TEM analysis on the excessively thin area 306b in FIG. 5E. It can be seen that the quality of the TEM picture 503 is poorer than that of the TEM picture 501 in FIG. 6A. It can be seen from the TEM picture 503 that a slight damage occurs to the material of the chip sample 301.

The present application is described in detail above via specific embodiments, which, however, do not intended to limit the present application. Without departing from the principle of the present application, those skilled in the art can also make many other changes and improvements, which shall also be considered as the scope of protection the present application.

What is claimed is:

1. A method for preparing a transmission electron microscope (TEM) sample, comprising the following steps:

step 1, providing a chip sample having a metal protective layer, the metal protective layer being formed on a first surface of the chip sample;

step 2, fixing the chip sample on a sample table of a focused ion beam (FIB) system;

step 3, performing a first time of FIB cutting on the metal protective layer using a FIB, so as to form a groove, wherein a first direction is a width direction of the subsequently formed TEM sample, and a second direction is a direction perpendicular to the first direction in the first surface, a direction of the first time of FIB cutting is the first direction, and the groove extends along the first direction, an inner side surface of the groove on a section along the second direction is arc-shaped, and in the second direction, the groove is located in an area for forming the TEM sample, a thickness of the metal protective layer at each position on the inner side surface of the groove gradually changes, and, from a top to a bottom of the groove, the thickness of the metal protective layer gradually decreases at various positions on the inner side surface of the groove; and step 4, performing a second time of FIB cutting on the chip sample using the FIB, the second time of FIB cutting thinning the chip sample and forming the TEM sample, wherein a direction of the second time of FIB cutting is a third direction, and the third direction is a direction from the metal protective layer to the chip sample, wherein, in the second time of FIB cutting, a cutting rate at a corresponding position is adjusted by means of the thickness of the metal protective layer, so as to adjust a width of the TEM sample, wherein, in an area for forming the groove, the width of the TEM sample gradually changes due to a feature that the thickness of the metal protective layer gradually changes, from the top to the bottom of the groove, utilizing the characteristic of gradually decreasing thickness of the metal protective layer at the various positions on the inner side surface of the groove, the cutting rate at each position on the inner surface of the groove gradually increases, and the width of the TEM sample corresponding to each position on the inner surface of the groove gradually decreases, an optimal observation area for TEM analysis is obtained from the gradually changing width of the TEM sample.

2. The method for preparing the TEM sample according to claim 1, wherein the chip sample is obtained by cutting or thinning a wafer composed of a semiconductor substrate.

3. The method for preparing the TEM sample according to claim 2, wherein the metal protective layer is formed before or after the wafer is cut or thinned.

4. The method for preparing the TEM sample according to claim 2, wherein a semiconductor device layer is formed on the semiconductor substrate, and a top surface of the semiconductor device layer is the first surface.

5. The method for preparing the TEM sample according to claim 4, wherein, in step 4, a minimum width of the optimal observation area of the TEM sample is 30 nm or less than 10 nm.

6. The method for preparing the TEM sample according to claim 2, wherein the thickness of the metal protective layer is 2-5 μm.

7. The method for preparing the TEM sample according to claim 6, wherein, in step 3, the arc shape of the inner side surface of the groove on the section along the second direction comprises a circular arc shape.

8. The method for preparing the TEM sample according to claim 7, wherein the diameter of a circle corresponding to the circular arc shape is 3-10 μm.

9. The method for preparing the TEM sample according to claim 1, wherein a material of the metal protective layer comprises platinum or tungsten.

10. The method for preparing the TEM sample according to claim 1, wherein, in step 1, a thickness of the chip sample is 300-1000 nm.

11. The method for preparing the TEM sample according to claim 1, wherein, in step 2, the chip sample is fixed on the sample table of the FIB system by being welded on a TEM copper ring.

12. The method for preparing the TEM sample according to claim 1, wherein the third direction is perpendicular to the first surface.

13. The method for preparing the TEM sample according to claim 1, wherein the second time of FIB cutting forms a first side and a second side of the TEM sample sequentially, and outside the groove, the first side and the second side of the TEM sample are parallel to each other and are perpendicular to the width direction of the TEM sample.

14. The method for preparing the TEM sample according to claim 1, wherein during the second time of FIB cutting, a loss occurs to the thickness of the metal protective layer; and when the metal protective layer is fully removed and a damage occurs to a material of the chip sample at the bottom, the second time of FIB cutting ends.

* * * * *